United States Patent
Holmberg et al.

(10) Patent No.: US 6,216,771 B1
(45) Date of Patent: *Apr. 17, 2001

(54) METHOD AND APPARATUS FOR ARRANGING HEAT TRANSPORT

(75) Inventors: Ulf I. Holmberg, Järfälla; Björn Gudmundsson, Sollentuna, both of (SE)

(73) Assignee: Telefonaktiebolaget LM Ericsson (publ), Stockholm (SE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/993,783

(22) Filed: Dec. 18, 1997

(30) Foreign Application Priority Data

Dec. 20, 1996 (SE) .................................... 9604705

(51) Int. Cl.$^7$ ........................................ H05K 7/20
(52) U.S. Cl. ................ 165/46; 165/804; 165/104.33; 361/699
(58) Field of Search ............... 165/46, 80.4, 104.33; 138/DIG. 8; 361/698, 699

(56) References Cited

U.S. PATENT DOCUMENTS

| | | | |
|---|---|---|---|
| 790,971 | * 5/1905 | Nicholls | 138/DIG. 8 X |
| 2,254,406 | * 9/1941 | Zarotschenzeff | 165/46 X |
| 3,032,357 | * 5/1962 | Shames et al. | 138/DIG. 8 X |
| 4,020,399 | 4/1977 | Suzuki et al. . | |
| 4,109,707 | * 8/1978 | Wilson et al. | 165/46 |
| 4,851,856 | 7/1989 | Altoz | 343/720 |
| 4,938,279 | * 7/1990 | Betker | 165/46 |
| 4,997,032 | 3/1991 | Danielson et al. | 165/46 |
| 5,000,256 | 3/1991 | Tousignant | 165/46 |
| 5,006,924 | 4/1991 | Frankeny et al. | 357/82 |
| 5,007,478 | 4/1991 | Senupta | 165/10 |
| 5,343,940 | * 9/1994 | Jean | 165/104.33 |
| 5,404,270 | 4/1995 | Carlstedt | 361/689 |
| 5,740,018 | * 4/1998 | Rumbut, Jr. | 361/720 |

FOREIGN PATENT DOCUMENTS

| | | |
|---|---|---|
| 26 38 702B2 | 3/1978 | (DE) . |
| 139 513 | 1/1980 | (DE) . |
| 0 014 249 | 8/1980 | (EP) . |
| 0 014 249A1 | 8/1980 | (EP) . |
| 0 309 279 | 3/1989 | (EP) . |
| 0 573 533 | 12/1993 | (EP) . |
| 0 580 412 | 1/1994 | (EP) . |
| 0 580 412A1 | 1/1994 | (EP) . |
| 92/10692 | 9/1992 | (WO) . |

OTHER PUBLICATIONS

Print of English Abstract from JP 3 60–0220954A, cited in Altoz reference, Published Nov. 1985.*
Patent Abstracts of Japan, vol. 15, No. 159, E–1059, abstract of JP A 3–30399, Feb. 8, 1991 (Matsugi).
Piled Electronics AB "The cool company", Pile it up! Increase the speed!, 8 pages.

* cited by examiner

*Primary Examiner*—Allen Flanigan
(74) *Attorney, Agent, or Firm*—Burns, Doane, Swecker & Mathis, L.L.P.

(57) ABSTRACT

A method and means for arranging heat transport, i.e. cooling or heating, of electrical components, are disclosed. Embodiments of the invention show how one or several flexible tubes (130) are arranged in connection with units (101) comprising electrical components. The units (101) can be enclosed in cabinets (100). The tube (130) can be arranged in a zigzag pattern around the units (101) and pressurized by a fluid from a combined pump and heat exchanger (103). The pressure expands the wall of the tube (130), thus creating thermal contact with the units (101). By flowing fluid in the tube (130) heat can be transported from or to the units (101). Tubes (130) arranged in several cabinets (100) can be connected, either in series or in parallel.

25 Claims, 4 Drawing Sheets

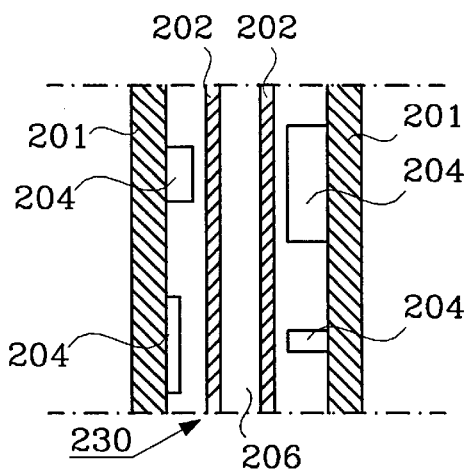
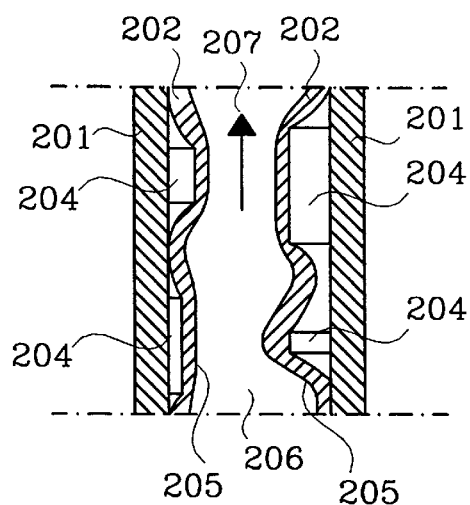
FIG. 2A  FIG. 2B
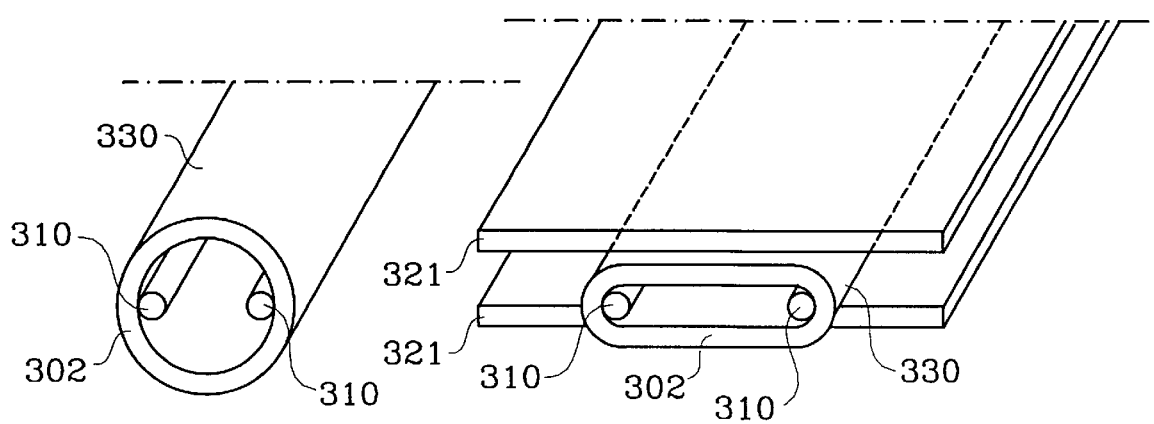
FIG. 3A  FIG. 3B
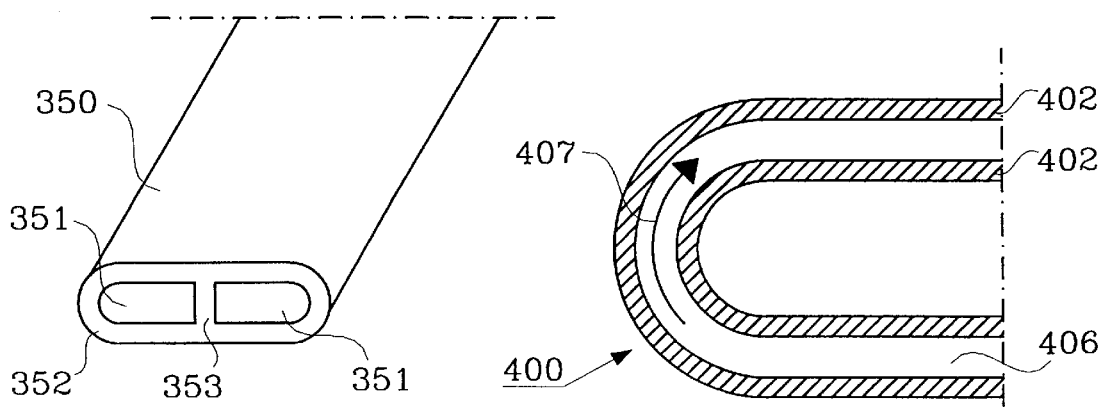
FIG. 3C  FIG. 4

METHOD AND APPARATUS FOR ARRANGING HEAT TRANSPORT

TECHNICAL FIELD OF THE INVENTION

The present invention relates to a method and an apparatus for fluid based transport of heat, in connection with electrical equipment, such as e.g. printed circuit boards.

DESCRIPTION OF RELATED ART

In practice, all electrical components generate heat when in operation. This is of particular interest, and usually also a source of problems, in situations and applications where many electrical components are situated close together in confined spaces. Since most components have an upper temperature limit at which they can operate reliably, removal of excess heat is of vital importance. Many solutions to this problem exist, and a separation into two types of cooling systems can be identified. One group of solutions is characterized by air-flow around the heat generating equipment. This is a common case, and usually calls for relatively large heat sinks mounted on the heat generating components. An obvious drawback of constructions of that type is that they are bulky. It is also difficult to create air-flows large enough and in the right place, in order to cool the components efficiently. Usually large fans are needed, making the constructions even more complicated and bulky.

In a second type of solution, cooling is obtained by direct or indirect thermal contact between the components and a heat transporting fluid inside a pipe or tube. Both of these kinds of fluid based solutions have disadvantages, as will be exemplified below by a few previously disclosed inventions.

The German patent DD-139513 discloses an apparatus for cooling sealed electric equipment. Flexible metal pipe coils are situated inside a housing containing electric modules. Air is forced through the pipe, and acts as a heat carrying fluid. One end of the pipe can be connected to a fan in order to increase the flow of fluid through the pipe.

A drawback of the apparatus presented in DD-139513 is that there is no direct thermal contact between the pipe and the heat generating modules. There is an air interface which makes the transport of heat ineffective.

Another cooling device is disclosed in the American patent U.S. Pat. No. 4,851,856. A rigid tube with a multitude of slots along its length is situated adjacent to heat generating electric modules. Inside the rigid tube is a flexible hose, through which hose a coolant fluid is introduced under pressure. The pressure of the fluid expands the hose outwards through the slots, creating direct contact between the walls of the hose and the heat generating modules.

A drawback of the invention disclosed in U.S. Pat. No. 4,851,856 is that it is necessary to have a rigid tube holding the flexible hose in place. Also, the locations of the slots are fixed and can not be altered unless the rigid tube is exchanged. This means that it is a complicated construction which is difficult to adjust to different configurations of heat generating modules.

A third disclosure of cooling electric equipment by fluid, can be found in U.S. Pat. No. 5,404,270. Cooling units with flexible walls are situated between electric circuitry packages. The cooling units and the packages having more or less the same physical dimensions. Pressurized fluid bring the cooling units in contact with the heat generating electric packages.

A drawback of the invention disclosed in U.S. Pat. No. 5,404,270 is that, in order to cool several electric packages, a plurality of cooling units coupled in parallel is needed. This leads to a system comprising a plurality of coupling units, which in turn means large complexity and increased probability of leaks.

SUMMARY OF THE INVENTION

The problems addressed by the present invention, as suggested by the drawbacks of the documents cited above, can be stated as follows.

A first problem is how to transfer heat in connection with electric equipment without using bulky heat sinks and fans.

Another problem is how to accomplish heat transfer means that are simple in construction and easy to install and reconfigure with respect to varying configurations of electric equipment.

Yet another problem is how to accomplish heat transfer means that are reliable with respect to leaks.

Although not explicitly mentioned in the problems, as stated above, it is obviously the case that the heat transfer methods means should also be capable of transporting heat to electric equipment (i.e. heating), as well as the more common case of transporting heat from the equipment (i.e. cooling).

The object of the present invention is hence to overcome the problems stated above. This is accomplished by arranging a flexible tube, said tube being pressurized and brought in direct thermal contact with heat generating components, through which tube a heat carrying fluid is flowing.

A method for solving the problems stated above, discloses how to arrange heat transport in connection with electric components. The components are situated on sub-units, such as e.g. printed circuit boards. The sub-units can be housed in main units, such as e.g. cabinets. A flexible tube is arranged in connection with the sub-units. The tube is connected to means capable of supplying fluid into the tube and also pressurizing the fluid. Fluid is then introduced into the tube and pressurized. By the pressure, the fluid flows through the tube and the tube wall gets in thermal contact with the electric components and heat can be transferred between the fluid and the components.

A system for heat transport is also disclosed, which system comprises electric components on sub-units. The sub-units being in contact with a flexible tube through which tube a pressurized fluid is flowing.

An advantage of the invention is that it facilitates both the installation and the re-configuration. The tube is in one single piece and it is flat and flexible until it is pressurized. When de-pressurized it is easy to remove from the system without need to remove the electric equipment.

Another advantage is that, since the tube is flexible and can be of almost arbitrary length, it is easy to configure a flexible system, where modules of electric equipment can be added and removed without having to change tube. One tube can be used for different sized units comprising the electric equipment.

Yet another advantage is that, by having a tube in one single piece, the risk of leaks is minimized. This is due to the fact that there are no couplings inside the units where the tube is arranged.

Yet another advantage is that smaller cabinets can be used, as compared to systems that are cooled by air freely streaming in the cabinet. There is no need for large heat sinks and fans.

Yet another advantage by having a tube containing the heat carrying fluid, is that the disadvantage of having potentially dirty air flowing around electric components, which may harm the components.

BRIEF DESCRIPTION OF THE DRAWINGS

FIG. 2A shows a schematic cross sectional view of a tube arranged between two sub-units comprising electric components.

FIG. 2B shows a schematic cross sectional view of a tube containing fluid, the tube wall being in contact with sub-units comprising electric components.

FIG. 3A shows a schematic view of a part of a tube.

FIG. 3B shows a schematic view of a flattened tube between two sub-units.

FIG. 3C shows a schematic view of a part of an alternative embodiment of a tube.

FIG. 4 shows a schematic cross-sectional view of a bend in a tube.

DETAILED DESCRIPTION OF PREFERRED EMBODIMENTS

In order to demonstrate embodiments of methods according to the invention, a number of examples of embodiments of means used in connection with the methods will be disclosed.

Figure 1A:
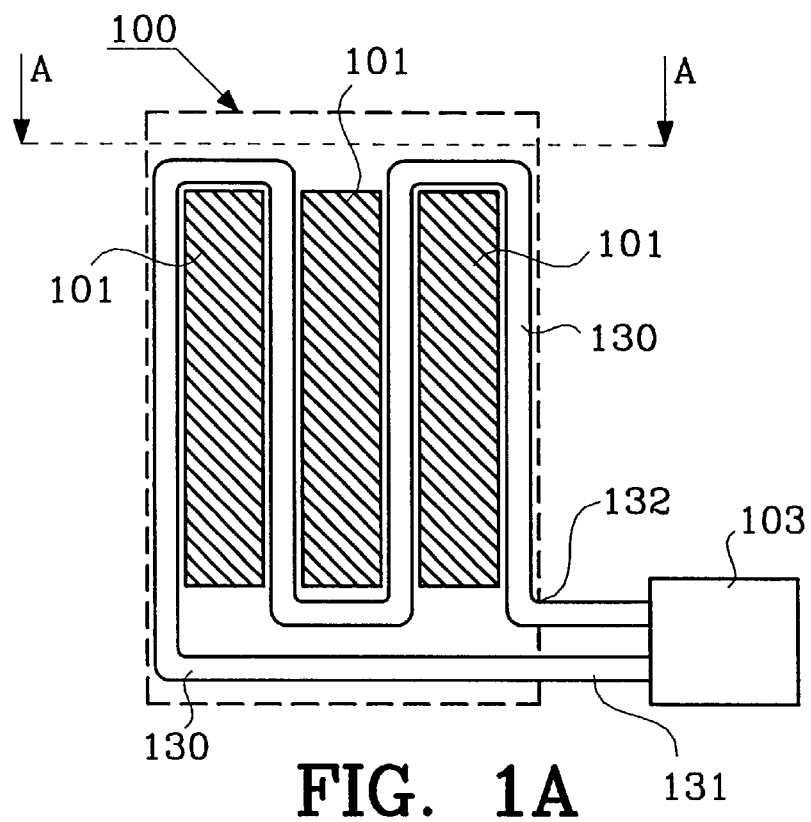
FIG. 1A shows a schematic view of a system according to the invention.
Figure 1B:
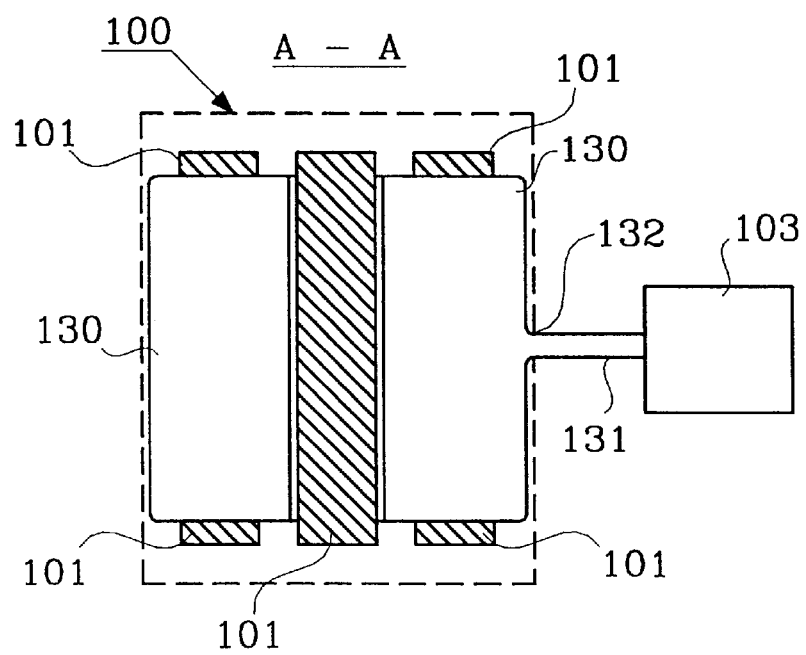
FIG. 1B shows another view of the system in FIG. 1A.

FIG. 1A and FIG. 1B shows schematically two different views of a main unit 100, a side view in FIG. 1A, and a top view in FIG. 1B. The main unit 100 comprises three electric modules 101. The modules 101 are in the figures represented only as featureless blocks. However, the blocks may comprise any type of electric equipment, a typical example being printed circuit boards (PCB) on which are mounted electric components. A flexible tube 130 is arranged in a zigzag pattern around the modules 101. The tube is flat and extends almost the width of the electric modules 101. The end parts 131 of the tube 130 are less wide than the part of the tube 130 which is inside the main unit 100 and are connected to a heat exchanger 103. However, embodiments where the tube 130 is of the same width along its entire length can easily be envisaged. The heat exchanger 103 can be of conventional type well known in the art, including (not shown in the figures) pumping means for pressurizing the tube 130 and introducing fluid, and means for controlling its function. Needless to say, the heat exchanger 103 can act both as a cooling unit as well as a heating unit. Heating may be necessary when starting a system, comprising the electrical components, which is located in a cold environment.

The tube 130 in FIG. 1A and FIG. 1B is not pressurized and is hence not in direct physical contact with the electric modules 101, and thus illustrating a situation where the modules 101 and the tube 130 can be removed or rearranged.

FIG. 2A shows a detailed cross sectional view of a tube 230 with a tube wall 202, situated between two electric modules 201. The modules contain a number of heat generating electric components 204. the components 204 can be of any kind, as is illustrated by them all having different shape. Within the wall 202 of the tube 130 is a fluid 206. The fluid 206 is not pressurized and is thus not exerting a force on the wall 202.

FIG. 2B illustrates a situation where the fluid 206 is pressurized. The pressure may e.g. be supplied by pumping means, as briefly discussed in connection with FIGS. 1A and 1B. Within the tube wall 202 the fluid 206 flows in a direction 207. The pressure of the fluid 206 exerts a force on the inside 205 of the tube wall 202. Since the tube wall 202 is elastically flexible it bulges radially outwards, pressing the tube wall 202 against the components 204.

FIGS. 3A and 3B illustrate how a tube 330 with circular cross section is flattened and arranged between two modules 321. The only prerequisite with respect to the tube 330 is that its wall 302 is elastically flexible. The cross sectional shape of the tube 330 may be circular, as in FIG. 3A, but may also be of any shape, such as polygonal with any number of vertices. Within the tube 330 are two spacer threads 310, whose purpose is to keep bends 400 in the tube 302 from getting blocked when it is folded and flattened as in FIGS. 1A and 3B respectively. Also, with reference to FIG. 4, the spacers 310 prevent the tube walls 402 from blocking flow 407 of fluid 406 in sharp bends 400. The spacers 310 may also have an arbitrary cross sectional shape, e.g. circular as in FIGS. 3A and 3B. They have to be firm enough to prevent blocking of the tube 330, but still flexible enough to allow easy installation of the tube 330 between modules such as in FIG. 1A. It is not necessary that the spacers 310 are separate with respect to the tube wall 302. They can be flange-like and form an integral part of the tube wall 302 itself, and also be in a form of individual knobs protruding from the inside wall 205 of the tube 130.

There are few restrictions regarding the material of the tube. As long as the material is flexible and able to conduct heat between the outer surface of the tube and the fluid in the tube, any suitable material may be used.

A configuration with a tube 350 comprising two separate fluid channels 351 is sketched in FIG. 3C. Opposite inside walls 352 of the tube 350 are joined by an joining wall segment 353. The joining wall segment 353 can act as a spacer unit as described in connection with the spacer threads 310 above. A tube 350 with separate channels 351 is applicable in situations where redundancy is needed. The channels 351 may be supplied with fluid from separate sources and thus being able to function if one fluid source fails. Naturally, any multiplicity of channels 351 may be envisaged in multiply redundant systems.

Figure 5:
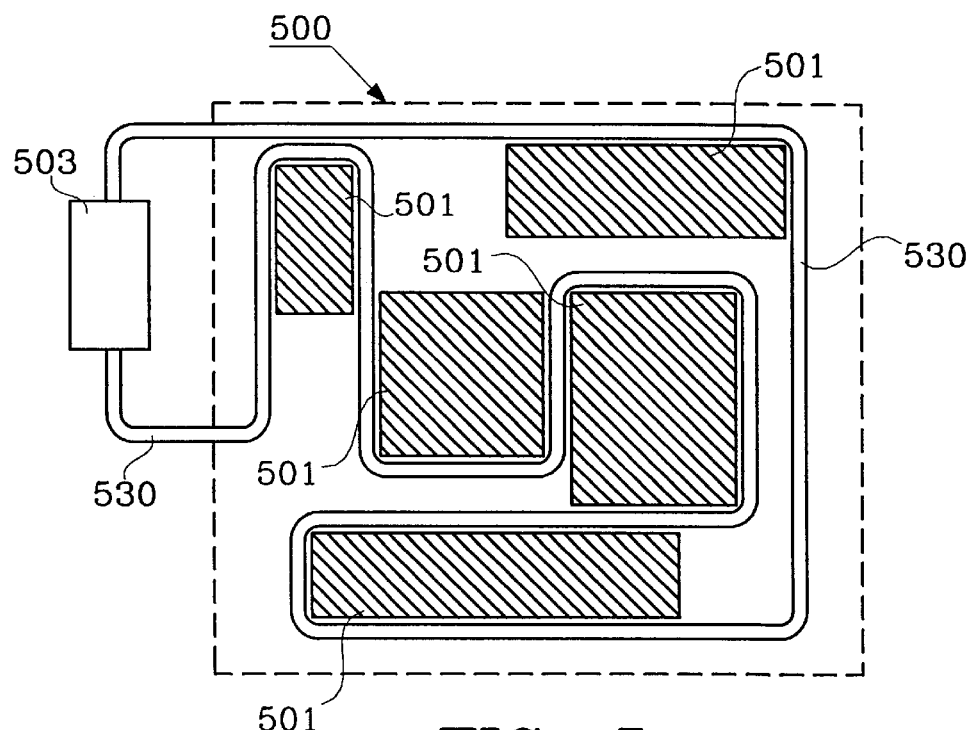
FIG. 5 shows a schematic view of a second embodiment of a system according to the invention.

FIG. 5 illustrates schematically a main unit 500 comprising a number of electric modules 501. A tube 530 is arranged between the modules 501, much in the same way as the tube 130 in FIGS. 1A and 1B. Connected to the tube 530 is a combined pump and heat exchanger 503. The purpose of illustrating a main unit 500 as in FIG. 5, is to show that the electric modules 501 do not necessarily have to be of PCB shape and placed in a row, as in FIGS. 1A and 1B. Rather, the inventive means and methods are applicable to main units 500 containing modules 501 of practically any shape and mutual position.

Figure 6:
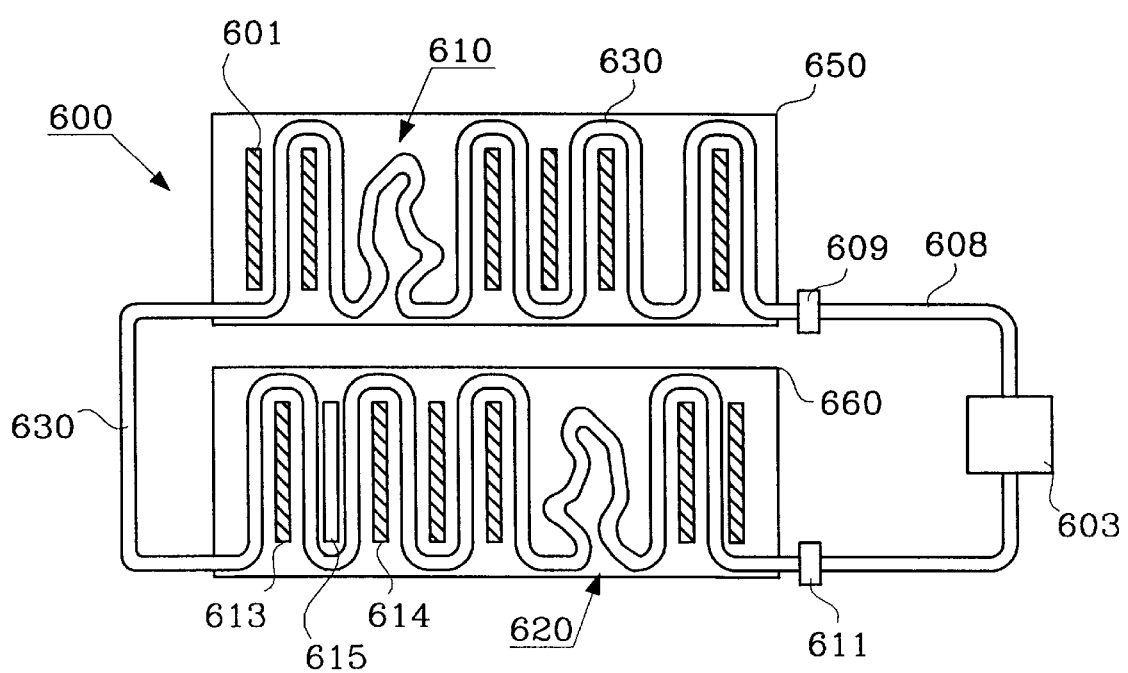
FIG. 6 shows a schematic view of a third embodiment of a system according to the invention.

FIG. 6 illustrates a system 600 which is a combination of two main units 650 and 660, e.g. in the form of cabinets. A flexible tube 630 is arranged, as shown in the examples above, between electric modules 601, which in this illustration are printed circuit boards. The tube 630 is in one single piece, and runs from one main unit 650 to the other 660. The tube 630 has one inlet 609 and one outlet 611. As in previous examples there is a combined pump and heat exchanger 603 to which the inlet 609 and the outlet 611 of the tube 630 is connected.

Illustrating the versatility of the invention, two sections 610,620 of the tube inside the main units 650 and 660 respectively, are not arranged around an electric module 601. This may be a common case in a system 600 where a module 601 may be removed. Moreover, it illustrates the fact that it is not necessary for the tube 630 to be specifically designed, at least in terms of length, for a particular system 600. Rather, a tube 630 can be used in systems with varying numbers of main units 610,620 and varying numbers of electric modules 601 within the main units. If modules 613,614 have a relatively large separation, which may be the case when a module 601 is removed, a retaining "dummy" module 615 may be needed in its place. The retaining module 615 allows the tube 630 to get in contact with the modules 613,614 when the tube 630 is pressurized.

Another use of a retaining "dummy" module 615 may be as an extra heat exchanging unit. Applications may exist where heat is generated in such an amount that the fluid must be cooled during its passage through the main units 660, necessitating an intermediate temperature regulating unit.

The main units 650,660 can be electrically interconnected. However, this is not shown as it is not essential for the purpose of illustrating the invention. An example of a system 600 such as in FIG. 6, may be a rack of transceiver modules in a radio base station, forming part of e.g. a mobile telephone system.

Below will be described two methods according to the invention. First, a method of cooling a main unit comprising a number of printed circuit boards, and a second method, describing cooling of a system of main units comprising cabinets of electric equipment. Although both methods disclose inventive methods where cooling is the main feature, it is obvious that methods describing heating would comprise identical steps as the cooling methods. The only difference being that instead of the word cooling, the word heating would be used. The means for cooling and heating are the same, including the hose and the heat exchanger.

A method of cooling the main unit 100 comprising a number of heat generating electric modules 101,201,321 will now be described. In order to clarify the steps of the method, references will be made to FIGS. 1A,1B,2A,2B,3 and 4. It will be assumed that in the exemplifying embodiment, the electric modules 101,201,321 are printed circuit boards (PCB's) comprising integrated circuits and other heat generating components, such as power transistors. The method comprises the steps:

Flattening the flexible tube 130,230,330 of a material that is heat conducting. The thickness of the wall 202,302 is arbitrary, as long as the tube 130,230,330 can be flattened. The length of the tube 130,230,330 is at least enough to cover the PCB's 101,201,321 according to the following step.

Arranging the tube 130,230,330 between the PCB's 101,201,321. The PCB's 101,201,321 being spaced such that they allow the flattened tube 130,230,330 to fit in between the facing surfaces of the PCB's 101,201,321. The length of the tube 130,230,330 is enough to cover the intended PCB 101,201,321 surfaces. The ends of the tube 130,230,330 protrude outside the main unit 100 through openings 132 in the unit 100.

Attaching the ends 131 of the tube 130,230,330 to a combined pump and heat exchanger 103. The combined pump and heat exchanger 103, as well as any coupling means are well known in the art, and are outside the scope of the present invention, and will thus not be described further here.

Introducing fluid 206,406 into the tube 130,230,330. This is accomplished using the combined pump and heat exchanger 103, possibly using an external reservoir (not shown in any of the figures). Any fluid capable of carrying heat may be used, water being an appropriate example.

Pressurizing the fluid 206,406 using the pumping means in the combined pump and heat exchanger 103. This action expands the tube 130,230,330 in a direction perpendicular to the general direction of flow 207,407 in the tube 130,230,330. The pressure may be regulated with the combined pump and heat exchanger 103 and a pressure level is reached at which the wall 202,302 of the tube is in thermal contact with the surfaces of the components 204 on the PCB's 101,201,321.

Switching on the electric equipment on the PCB's 101, 201,321, resulting in heat being generated in the electric components 204.

Pumping the fluid 206,406 through the tube 130,230,330 resulting in heat transfer from the components 204 through the tube wall 202,302 and into the fluid 206,406.

Removing the heat from the fluid 206,406 in the combined pump and heat exchanger 103. As mentioned above, this step is well known in the art of cooling/heating and is not further explained here.

Figure 7:
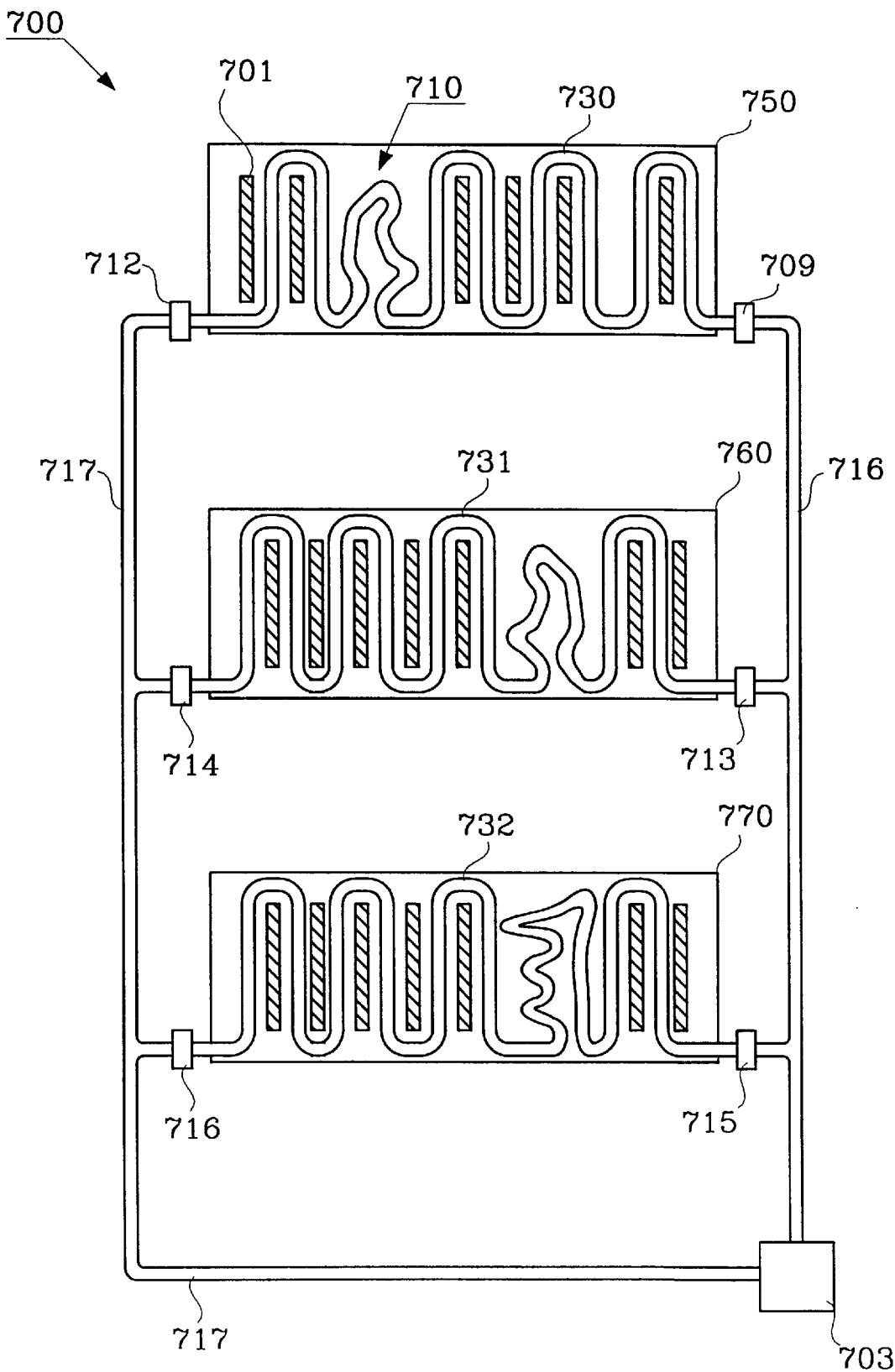
FIG. 7 shows a schematic view of a fourth embodiment of a system according to the invention.

Before disclosing a second embodiment of a method according to the invention, a system 700 in which the method is applied, will be described in connection with FIG. 7.

The system 700 comprises three main units in a form of cabinets, a first cabinet 750, a second cabinet 760 and a third cabinet 770. Each of the cabinets 750,760,770 comprises a number of sub-units 701. On the sub-units 701 are mounted, as in previously described examples, electrical components that are generating heat. The cabinets 750,760, 770 each comprise a flexible tube 730,731 and 732 respectively. As in previous examples, the tubes 730,731,732 inside the cabinets 750,760,770 are located partly between the sub-units 701. Each tube 730,731,732 has an inlet connector 709,713 and 715 respectively. These inlet connectors 709,713,715 are all connected to an inlet pipe 716 which is connected to a combined pump and heat exchanger, as in previous examples. Each tube 730,731,732 also has an outlet connector 712,714 and 716 respectively. These outlet connectors 712,714,716 are all connected to an outlet pipe 717 which is connected to the combined pump and heat exchanger, thus making a closed system of tubes where the main unit tubes 730,731,732 are connected in parallel between the inlet pipe 716 and the outlet pipe 717.

Below will be described a method of arranging a system for cooling of a system 700 as described above. The system 700 is in this embodiment assumed to be a part of a radio transceiver system intended to form part of a radio base station in a mobile telephone system. Naturally, implementations of the invention are not limited to radio base stations. But in order to demonstrate features of flexibility and modularity, a system 700 of radio transceivers is a realistic choice. The method will include a step where a cabinet 760 will be disconnected from the system 700 and replaced. A step where a separate sub-unit 701 is removed during normal operation of the system 700, will also be included. These steps are occurrences that are not entirely uncommon in systems such as radio base stations in telephone networks, and hence this choice of exemplifying system.

Certain steps of the following method will be very similar, and refer back, to steps disclosed in connection with the previous embodiment of an inventive method, and will hence be rather concise. Also, references will be made to previously described figures, i.e. FIGS. 2A,2B,2C,3A,3B, 3C and 4. It will be assumed that necessary electric connections in the cabinets 750,760,770 as well as electric connections between them are present. However, no electric connections are shown in the figures or discussed. This is intentional, based on the fact that implementing and operating a system 700, such as a radio base station, is well known in the art and would only serve as a distraction if included in this description.

A method of arranging a system for cooling comprises the following steps:

Arranging the tubes 730,731,732 in the cabinets 750,760 and 770 respectively. The tubes 730,731,732 are not pressurized during at this stage, and the arrangement can easily be done in zigzag patterns around the sub-units 701.

Connecting the inlets 709,713,715 of the tubes 730,731, 732 to the inlet pipe 716, and connecting the outlets 712, 714,716 of the tubes 730,731,732 to the outlet pipe 717.

Connecting the inlet pipe 716 and the outlet pipe 717 to a combined pump and heat exchanger 703, as described in previous examples.

Introducing pressurized fluid into the tubes 730,731, 731 from the combined pump and heat exchanger 703, through the inlet pipe 716. As described in a previous example, this action expands the tube walls 202 until thermal contact is established with the sub-units 701.

Pumping the fluid in a circulating loop through the inlet tube 716, the flexible tubes 730,731,732 and the outlet tube 717.

Electrically activating the sub-units 701 in the cabinets 750,760,770, thus generating heat in the sub-units 701 which is transferred to the circulating fluid.

Removing heat from the fluid in the combined pump and heat exchanger 703.

Stopping the pump 703 and thus de-pressurizing the tubes 730,731,732. This de-pressurization removes the contact between the tubes 730,731,732 and the sub-units 701.

Removing a sub-unit 701 from the first cabinet 750, and replacing the sub-unit 701 with a similar replacement unit.

Starting the pump 703, and thus re-pressurizing the tubes 730,731,732 and restoring contact between tube walls 202 and sub-units 701.

Removing heat from the fluid in the combined pump and heat exchanger 703.

Stopping the pump 703 and thus de-pressurizing the tubes 730,731,732.

Detaching the second cabinet 760 from the system 700. It is assumed that the connections between the tube 731 in the cabinet 760 and the inlet pipe 716 and the outlet pipe 717 are of a construction which prevents fluid from flowing out of the pipes 716,717. Constructions of such a character are well known in the art of plumbing, and will not be further discussed here. In fact, it may even be the case that the previous step of de-pressurizing may not be necessary. Depending on the character of the tube-pipe connections 713,714, the circulating flow of fluid may continue even during a detachment of one of the cabinets 760.

Re-starting the pump 703.

Removing heat from the fluid in the combined pump and heat exchanger 703.

In the above disclosed embodiments, there have been shown single tubes in operation transporting heat in connection with units comprising electric components. Solutions with redundancy can easily be implemented by arranging two separate tubes side by side or one on top of the other, possibly having fluid supplied from separate sources. This would increase reliability in case of leaks.

Another feature not discussed in detail above is the question of what kind of fluid to use. The only necessary requirement on the fluid is that it should be capable of carrying heat. Almost any liquid would be appropriate. Water, however, being a much preferred alternative due to its outstanding thermal properties. It may be feasible to use a gaseous fluid, particularly in cases where a leak in the form of a liquid would be seriously detrimental to the equipment subject to the leak.

What is claimed is:

1. A system for heat transport in connection with electrical components in at least one main unit, the system comprising:
   at least one sub-unit of the main unit, the sub-unit including electrical components; and
   at least one flexible tube containing a fluid,
   wherein the tube is flexible, the tube having an inlet and an outlet for the fluid, the tube having a substantially constant cross-sectional diameter in an unpressurized condition and being bendable around the electrical components, and a wall of the tube is in contact with at least one surface of the unit when in operational mode, the operational mode comprising that the tube is pressurized, and wherein the tube is self-supported relative to the electrical components and is otherwise unsupported by external supporting means.

2. A system according to claim 1, wherein the wall of the tube is elastically deformable.

3. A system according to claim 1, wherein the wall of the tube is plastically deformable.

4. A system according to claim 1, wherein the main unit comprises at least two sub-units and that the sub-units having at least one mutually facing surface forming a space between the sub-units.

5. A system according to claim 1, wherein at least partly along the length of the tube only one side of the tube is in contact with at least one sub-unit.

6. A system according to claim 1, wherein the tube has bends.

7. A system according to claim 6, wherein the tube is bent predominantly in a zigzag pattern at least partly around the sub-unit.

8. A system according to claim 1, wherein the inside of the tube comprises at least one spacer unit which keeps opposing parts of the inside wall of the tube separate, enabling fluid to flow through the bends of the tube.

9. A system according to claim 8, wherein the spacer unit is thread-like and extending along at least a part of the length of the tube.

10. A system according to claim 8, wherein the spacer unit is forming at least one joining wall segment forming at least two separate channels in the tube.

11. A system according to claim 8, wherein the spacer unit comprises a multitude of knobs protruding from the inside wall of the tube, the knobs being distributed along at least a part of the length of the tube.

12. A system according to claim 1, the system comprising at least two main units, wherein one single tube extends through the main units.

13. A system according to claim 1, the system comprising at least two main units, wherein each main unit comprising a separate tube, the tubes being connected together.

14. A system according to claim 13, wherein the tubes are connected in series.

15. A system according to claim 13, wherein the tubes are connected in parallel.

16. A system according to claim 1, wherein the at least one main unit forms part of a mobile radio telephony system.

17. A system according to claim 16, wherein the at least one main unit forms a radio transceiver unit.

18. A system according to claim 1, further comprising heat removal means connected to the tube.

19. A system according to claim 18, wherein the heat removal means are placed at least partly outside the main unit.

20. A system according to claim 18, wherein the heat removal means are placed at least partly inside the main unit.

21. A system according to claim 20, wherein the heat removal means comprises at least one intermediate temperature regulating unit.

22. A system according to claim 1, wherein it comprises heat addition means connected to the tube.

23. A system according to claim 22, wherein the heat addition means are placed at least partly outside the main unit.

24. A system according to claim 22, wherein the heat addition means are placed at least partly inside the main unit.

25. A system according to claim 24, wherein the heat addition means comprises at least one intermediate temperature regulating unit.

* * * * *